United States Patent [19]

Nebe et al.

[11] Patent Number: 5,035,980

[45] Date of Patent: * Jul. 30, 1991

[54] PHOTOSENSITIVE SEMI-AQUEOUS DEVELOPABLE GOLD CONDUCTOR COMPOSITION

[75] Inventors: William J. Nebe, Wilmington, Del.; Osborne, James J., Kennett Square, Pa.

[73] Assignee: E. I. Du Pont de Nemours and Company, Wilmington, Del.

[*] Notice: The portion of the term of this patent subsequent to Mar. 13, 2007 has been disclaimed.

[21] Appl. No.: 396,490

[22] Filed: Aug. 21, 1989

[51] Int. Cl.⁵ .............................................. G03F 7/033
[52] U.S. Cl. ..................................... 430/281; 430/286; 430/287; 430/910; 430/905; 522/81

[58] Field of Search ................... 522/81; 430/281, 286, 430/287, 910, 905

[56] References Cited

U.S. PATENT DOCUMENTS

| | | | |
|---|---|---|---|
| 3,615,457 | 10/1971 | Seibert et al. | 430/281 X |
| 3,877,950 | 4/1975 | Felten | 96/115 R |
| 4,908,296 | 3/1990 | Nebe et al. | 430/330 X |
| 4,925,771 | 5/1990 | Nebe et al. | 430/330 X |

Primary Examiner—Cynthia Hamilton

[57] ABSTRACT

A semi-aqueous developable photosensitive gold conductive composition which is fireable in a nonoxidizing atmosphere is developable in an aqueous solution containing 0.63 percent by weight sodium borate and 8.7 percent by weight butyl cellusolve.

9 Claims, No Drawings

PHOTOSENSITIVE SEMI-AQUEOUS DEVELOPABLE GOLD CONDUCTOR COMPOSITION

FIELD OF INVENTION

The present invention is directed to an improved photosensitive gold conductor composition with high resolving power and semi-aqueous processability. Additionally, it functions as a precursor to a fired gold conductor pattern and has the ability to serve as a conductive material particularly useful in the formation of multilayer thick film circuits.

BACKGROUND OF THE INVENTION

Multilayer thick film circuits have been used for many years to increase circuit functionality per unit of area. Moreover, recent advances in circuit technology have placed new demands on gold materials for this use. Heretofore, most of the gold materials used in multiple circuits have been conventional thick film gold compositions. These are comprised of finely divided particles of gold solids and inorganic binders dispersed in an inert organic medium. Such thick film materials are usually applied by screen printing in the pattern desired for the conductor.

Thick film materials of this type are very important and will continue to be so. However, when applying these thick film materials in patterns by screen printing, it is difficult to obtain fine line and space resolution. It is essential that all the screen printing variables such as screen quality, squeegee hardness, print speed, dispersion properties, etc., be most carefully controlled and constantly monitored to obtain good product yields.

An alternative approach is (1) to apply a layer of the gold conductive material to a substrate by means of dispersion in a photosensitive medium, (2) to expose the layer imagewise to actinic radiation, (3) to solvent develop the pattern to remove unexposed portions of the layer, and (4) to fire the remaining exposed portions of the pattern to remove all remaining organic materials and to sinter the inorganic materials.

Such an approach is found in Felton, U.S. Pat. No. 3,877,950 issued Apr. 15, 1975. This patent discloses a coating composition which comprises an admixture of:
(a) finely divided particles of gold having a size of 0.4–4 $\mu$m,
(b) finely divided particles of an inorganic binder dispersed in an organic medium comprising,
(c) an organic polymeric binder selected from the group consisting of polymethylmethacrylates, polyethylmethacrylates and mixtures thereof,
(d) a photoinitiation system,
(e) photohardenable monomer, and
(f) volatile nonaqueous organic solvent.

As set forth in this patent processing involves the coating composition being (1) screen printed onto a ceramic substrate, (2) exposed imagewise to actinic radiation to effect hardening of the exposed areas of the composition, (3) organic solvent developed to remove unexposed areas of the composition, and (4) fired in air to effect volatilization of the organic medium and sintering of the inorganic binder.

A disadvantage of prior art photosensitive gold conductor compositions and particularly compositions disclosed in U.S. Pat. No. 3,877,950 is that an organic solvent is necessary to develop such material after imagewise exposure to actinic radiation, i.e., an organic solvent removes areas of the composition which have not been exposed to actinic radiation without removal of areas which have been exposed. Organic solvents are sometimes undesirable as they may pose health and environmental hazards. There exists a need, therefore, for a photosensitive gold conductor composition which, after exposure to actinic radiation, is developable in aqueous or semi-aqueous solution.

SUMMARY OF THE INVENTION

In its primary aspect the present invention is directed to a semi-aqueous developable photosensitive gold conductor composition which is fireable in an oxidizing or substantially nonoxidizing atmosphere comprising an admixture of:
(a) finely divided particles of gold solids having a surface area-to-weight ratio of no greater than 20 $m^2/g$ and at least 80 wt. % of the particles a size of 0.5–10 $\mu$m and
(b) finely divided particles of an inorganic binder having a glass transition temperature in the range of from 550° to 825° C., a surface area-to-weight ratio of no greater than 10 $m^2/g$ and at least 90 percent by weight of the particles having a size of 1–10 $\mu$m, the weight ratio of (b) to (a) being in a range from 0.0001 to 0.25, dispersed in an organic vehicle comprising
(c) an organic polymeric binder,
(d) a photoinitiation system,(e) photohardenable monomer, and
(f) an organic medium
wherein the improvement comprises the organic polymeric binder is a copolymer or interpolymer comprising (1) a nonacidic comonomer comprising a $C_1$–$C_{10}$ alkyl acrylate or $C_1$–$C_{10}$ alkyl methacrylate, and (2) an acidic comonomer comprising an ethylenically unsaturated carboxylic acid, with the proviso that all acid-containing monomers comprise from 5 to less than 15 weight percent of the polymer, wherein the organic polymeric binder has a molecular weight no greater than 100,000 and wherein the composition upon imagewise exposure to actinic radiation is developable in an aqueous solution containing 0.62 percent by weight sodium borate and 8.7 percent by weight butyl cellusolve.

In a secondary aspect, the invention is directed to a method of making the above-described photosensitive gold conductor composition wherein component (b) is freeze dried prior to mixing with the other components.

DETAILED DESCRIPTION OF THE INVENTION

The present invention is directed to an improved photosensitive gold conductor composition. Since components found in Felton U.S. Pat. No. 3,877,950 can be employed in the present invention as modified herein, this patent is incorporated by reference with portions directly reproduced herein. Also the same processing steps can be employed with compositions of the present invention as in U.S. Pat. No. 3,877,950 with the exception that a different developer must be employed to remove areas of the composition which have not been exposed to radiation.

A. Gold Solids

Virtually any shape gold powder, including spherical particles and flake (rods, cones, plates) may be used in practicing the invention. It is preferred that the particles be spherical. It has been found that the dispersion of the invention must contain no significant amount of solids having a particle size of less than 0.2 μm. When particles of this small size are present it is difficult to adequately obtain complete burnout of the organic medium when the films or layers thereof are fired to remove the organic medium and to effect sintering of the inorganic binder and the gold solids. In addition, none of the gold solids should exceed 20 μm. When the dispersions are used to make thick film pastes, which are usually applied by screen printing, the maximum particle size must not exceed the thickness of the screen. When the dispersions are used to make dry photosensitive film the maximum particle size must not exceed the thickness of the film. It is preferred that at least 80 percent by weight of the gold solids fall within the 0.5-10 μm range.

In addition, it is preferred that the surface area/weight ratio of the gold particles not exceed 20 m$^2$/g. When gold particles having a surface area/weight ratio greater than 20 m$^2$/g are used, the sintering characteristics of the accompanying inorganic binder are adversely affected. It is difficult to obtain adequate burnout and blisters may appear.

It is known that small amounts of other metals may be added to gold conductor compositions to improve the properties of the conductor. Frequently palladium is added to gold conductor compositions. The palladium powder will generally consist of palladium particles, approximately spherical in shape, preferably approximately 0.1 to 10 microns in diameter. The palladium powder comprises from about 0.05 to about 1.0 percent by weight of the total composition, and preferably from about 0.1 to about 0.5 percent.

Often, copper oxide is added to improve adhesion. The copper oxide should be present in the form of finely divided particles, preferably ranging in size from about 0.5 to 5 microns. When present as $Cu_2O$, the copper oxide comprises from about 0.1 to about 3 percent by weight of the total composition, and preferably from about 0.1 to 1.0 percent. Part or all of the $Cu_2O$ may be replaced by molar equivalents of CuO.

B. Inorganic Binder

The glass frit used in the present invention aids in sintering the gold particles and may be of any well known composition which has a melting temperature below that of the gold. Nevertheless, in order to get adequate conductivity of the devices, it is preferred that the glass transition temperature (Tg) of the inorganic binder be 550°-825° C. and still more preferably 575°-750° C. If the melting takes place below 550° C., organic material will likely be encapsulated and blisters will tend to form in the composition as the organics decompose. On the other hand, a glass transition temperature above 825° C. will tend to produce a composition with poor adhesion when sintering temperatures below 900° C. are used.

The glass frits most preferably used are the borosilicate frits, such as lead borosilicate frit, bismuth, cadmium, barium, calcium or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced form barium carbonate, etc. The glass is preferably milled in a vibratory (Sweco Co.) mill with water to reduce the particle size of the frit and to obtain a frit of substantially uniform size.

The frit is passed through a fine mesh screen to remove large particles since the solid composition should be agglomerate free. The inorganic binder should have a surface to weight ratio of no more than 10 m$^2$/g. Preferably at least 90 percent by weight of the particles have a particle size of 0.5-10 μm.

The inorganic binder is preferably 0.01 to 25 percent by weight of the weight of the gold. At higher levels of inorganic binder, the bondability to the substrate is reduced.

C. Organic Polymeric Binder

The binder polymer is critical to the compositions of the invention. It must allow for semi-aqueous processability and at the same time afford high resolution. It has been found that these requirements are met by selecting a binder which is a copolymer or interpolymer comprising (1) a nonacidic monomer comprising a $C_1$-$C_{10}$ alkyl acrylate, $C_1$-$C_{10}$ alkyl methacrylate or combinations thereof, and (2) an acidic comonomer comprising an ethylenically unsaturated carboxylic acid with the proviso that acid-containing monomers comprise at least 5 and less than 15 percent by weight of the total polymer weight. A preferred range is from 8 to 12 percent.

The presence of the acidic comonomer component of the composition is critical to this technology. The acid functionality yields developability in a mixture of water and a water-miscible organic solvent, such as a solution of 0.62 percent by weight sodium borate and 8.7 percent by weight butyl cellusolve in water. Developability herein can be referred to as semi-aqueous processability as disclosed in Alles U.S. Pat. No. 3,458,311 which is incorporated by reference herein. If the concentration of acidic comonomers is less than about 5% by the weight of the polymer, the compositions do not wash out in semi-aqueous basic solutions. When more than 15% by weight acidic comonomers are present, poor development quality results. Suitable acidic comonomers include ethylenically unsaturated monocarboxylic acids such as acrylic, methacrylic and crotonic acids and ethylenically unsaturated dicarboxylic acids such as fumaric, itaconic, citraconic, vinyl succinic and maleic acids as well as their half esters and, where appropriate, their anhydrides and mixtures thereof. Because they are cleaner burning in low-oxygen atmospheres, methacrylic polymers are preferred over acrylic polymers.

It is preferred that the alkyl acrylate or alkyl methacrylate comonomers constitute at least 75 and preferably 88-92 wt.% of the polymer.

Although not preferred, the nonacidic portion of the polymer binder can contain up to about 50 wt. % of other nonacidic comonomers as a substitute for the alkyl acrylate of alkyl methacrylate portion of the polymer. Examples include acrylonitrile, vinyl acetate, acrylamide, styrene, or methyl-styrene so long as the previously discussed compositional criteria are met as well as the physical criteria mentioned below. However, it is preferred to use not more than about 25 wt. % of such monomers because they are more difficult to burn out cleanly.

It will be recognized that a single copolymer or a combination of copolymers, each of which satisfies the above criteria, may be used as the binder. In addition to the above-described copolymers, it is possible to add small amounts of other polymeric binders. Examples of these include polyolefins such as polyethylene, polypropylene, polybutylene, polyisobutylene, and ethylene-propylene copolymers; and polyethers which are polymers of lower alkylene oxides, such as polyethylene oxide.

Polymers can be made by those skilled in the art of acrylate polymerization by conventional solution polymerization techniques. Typically, such acidic acrylate polymers are prepared by combining an a or b ethylenically unsaturated acid (acidic comonomer) with one or more copolymerizable vinyl monomers (nonacidic comonomer) in a relatively low boiling (75°-150° C.) organic solvent to obtain a 10 to 60% solution of the monomer mixture, then subsequently causing the monomers to polymerize by the addition of a polymerization catalyst and heating the mixture at the reflux temperature of the solution at atmospheric pressure. After the polymerization reaction is essentially complete, the resulting acid polymer solution is cooled to room temperature and samples are removed to determine the viscosity, molecular weight, acid equivalent, etc. of the polymer.

Additionally it is necessary to keep the molecular weight of the acid containing binder-polymer to a value no greater than 100,000, preferably not greater than 50,000, and more preferably not greater than 20,000.

If the composition is to be applied by screen printing the $T_g$ of the binder polymer preferably is above 100° C. After being screen printed the paste is usually dried at temperatures up to 100° C. and a $T_g$ below this value generally results in a very tacky composition. A lower $T_g$ value can be employed for a material applied by other than screen printing.

The organic polymeric binder is generally present in an amount of 5-45 percent by weight based on the total weight of the dry photopolymerizable layer.

D. Photoinitiation System

Suitable photoinitiation systems are those which are thermally inactive but which generate free radicals upon exposure to actinic light at or below 85° C. These include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethylanthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiators or photoinitiator system is present in an amount of 0.05 to 10% by weight based on the total weight of the dry photopolymerizable layer.

E. Photohardenable Monomer

The photohardenable monomer component of the v invention is comprised of at least one addition polymerizable ethylenically unsaturated compound having at least one polymerizable ethylenic group. Such compounds are capable of forming a high polymer by free radical initiated, chain propagating addition polymerization. The monomeric compounds are nongaseous, i.e., they have a normal boiling point above 100° C. and a plasticizing action on the organic polymeric binder.

Suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-1,2-di-(phydroxyphenyl)propane dimethacrylate, di-(3-methacryloxy-2-hydroxypropyl) ether of bisphenol-A, di-(2-methacryloxyethyl)ether of bisphenol-A, di-(3-acryloxy-2-hydroxypropyl)ether of bisphenol-A, di-(2acryloxyethyl) ether of bisphenol-A, di-(2-acryloxyethyl) ether of bisphenol-A, di-(3-methacryloxy-2-hydroxypropyl) ether of 1,4butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenylethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g. those having a plurality of addition polymerizable ethylenic linkages particularly when present as terminal linkages. Preferred monomers are polyoxyethylated trimethylolpropane triacrylate and methacrylate, ethylated pentaerythritol triacrylate, trimethylopropanetriacrylates and methacrylates, dipentaerythritol monohydroxypentaacrylate and 1, 10-decanediol dimethylacrylate. Other preferred monomers are monohydroxypolycaprolactone monoacrylate, polyethyleneglycol diacrylate (mol. wt. approximately 200), and polyethylene glycol 400 dimethacrylate (mol. wt. approximately 400). The unsaturated monomeric component is present in an amount of 2-20% by weight based on the total weight of the dry photopolymerizable layer.

F. Dispersant

It is preferred to add a dispersant to insure the efficient wetting of the inorganic by the organic polymers and monomers. A thoroughly dispersed inorganic is desirable in the preparation of a photoactive paste with the needed characteristics of good screen printing and leveling and fire out characteristics. The dispersant acts to allow the polymeric binder to associate or wet the inorganic solids, giving an agglomerate free system. The dispersants of choice are the A-B dispersants generally described in "Use of A-B Block Polymers as Dispersants for Non-aqueous Coating Systems" by H. L. Jakubauskas, Journal of Coating Technology, Vol. 58; Number 736; Pages 71-82. Useful A-B dispersants are disclosed in U.S. Pat. Nos. 3,684,771, 3,788,966, 4,070,388 and 4,032,698 and U.K. Patent 1,339,930 each of which is incorporated herein by reference. Preferred A-B dispersants are polymeric materials disclosed in U.S. Pat. No. 4,032,698 supra represented by the structure

where
Q is a polymeric or copolymeric segment of
  a. an ester of arcylic acid or metharcylic acid with an aklanol or 1-18 carbon atoms;
  b. styrene or acrylonitrile;
  c. a vinyl ester whose ester moiety contains 2-18 carbon atoms; or
  d. a vinyl ether;
X is the residue of a chain transfer agent;
Y is the residue of a di-, tri, or tetraisocyanate radical after removal of isocyanate groups;
A is the residue of a basic radical which, as an entity before reaction, has a $pk_a$ value of 5-14, or a salt thereof; and
m and n are 1, 2 or 3, the total not exceeding 4, provided that when n is 2 or 3, only one of A need be as defined.

A particularly preferred member of this class is a polymeric material, hereinafter identified as A-B persant I, represented by the structure

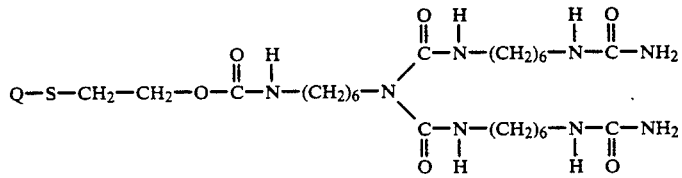

where Q is a methylmethacrylate polymeric segment having a weight average molecular weight between 6000 and 8000. Also particularly preferred is a member of a class of polymeric materials represented by the structure

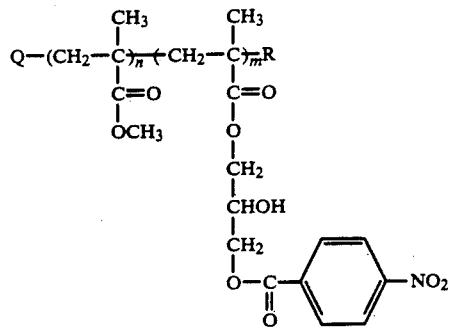

wherein Q is an alkyl methacrylate polymeric segment containing about 20 units of butyl methacrylate, n is 20, m is 8 to 12 and R is a chain terminator residue. This dispersant is hereinafter identified as A-B Dispersant II.

The dispersant is generally present in an amount of 0.1-5.0 percent by weight based on the photosensitive conductor composition.

G. Stabilizer

When copper or copper oxide is present in the gold conductor composition it is preferred to add a stabilizer. Without the stabilizer the copper or copper oxide reacts with the acid functionality in the polymeric binder resulting in the crosslinking of the formulation to an intractable hard mass. Any compound may be used which prevents such crosslinking without adversely affecting the other properties of the photosensitive conductor composition, either before or after firing. This may be accomplished by complexation with the copper or copper oxide, by salt formation with the acid functionality, or other reactions. Although the mechanism is not clearly understood, it has been found that triazole compounds function well as stabilizers in the compositions of the invention. Particularly preferred, is benzotriazole.

H. Organic Medium

The main purpose of the organic medium is to serve as a vehicle of the dispersion of the finely divided solids of the composition in such form that it can readily be applied to a ceramic or other substrate. Thus, the organic medium must first be one in which the solids are dispersible with an adequate degree of stability. Secondly, the theological properties of the organic medium must be such that they lend good application properties to the dispersion.

When the dispersion is to be made into a film, the organic medium in which the ceramic solids and inorganic binder are dispersed consists of the polymeric binder, monomer and initiator which are dissolved in a volatile organic solvent and, optionally, other dissolved materials such as plasticizers, release agents, dispersing agents, stripping agents, antifouling agents and wetting agents.

The solvent component of the organic medium, which may be a mixture of solvents, is chosen so as to obtain complete solution therein of the polymer and other organic components and to be of sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methylethyl ketone, 1,1,1-trichloroethane, tetrachloroethylene, amyl acetate, 2,2,4-triethylpentanediol-1,3-monoisobutyrate, toluene, methylene chloride, and ethylene glycol monoalkyl and dialkyl ethers such as ethylene glycol mono-n-propyl ether. For casting films, methylene chloride is particularly preferred because of its volatility.

Frequently the organic medium may also contain one or more plasticizers which serve to lower the Tg of the binder polymer. Such plasticizers help to assure good lamination to ceramic substrates and enhance the developability of unexposed areas of the composition. However, the use of such materials should be minimized in order to reduce the amount of organic materials which must be removed when the films cast therefrom are fired. The choice of plasticizers is, of course, determined primarily by the polymer which must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate triethyleneglycol diacetate and polyester plasticizers. Dibutyl phthalate is frequently used in acrylic polymer systems because it can be used effectively in relatively small concentrations.

The photopolymerizable composition is coated upon a support film at a dry coating thickness of about 0.0001 inch (0.0025 cm) to about 0.01 inch (0.025 cm) or more. A suitable strippable support which preferably has a high degree of dimensional stability to temperature changes may be chosen from a wide variety of films composed of high polymers, e.g., polyamides, polyolefins, polyesters, vinyl polymers, and cellulose esters and may have a thickness of from 0.0005 inch (0.0013 cm) to 0.008 inch (0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is transparent polyethylene terephthalate film having a thickness of about 0.0001 inch (0.0025 cm).

When an element contains no removable, protective cover sheet and is to be stored in roll form, the reverse side of the strippable support preferably has applied thereto a thin release layer of a material such as wax or silicone to prevent it from sticking to the photopolymerizable material. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.0001 inch (0.0025 cm) thick polyethylene is especially suitable. Supports and cover sheets as described above provide good protection to the photopolymerizable layer during storage prior to use.

On the other hand, when the dispersion is to be applied as a thick film paste, conventional thick film organic media can be used with appropriate theological adjustments and the use of lower volatility solvents.

When the compositions of the invention are formulated as thick film compositions, they will usually be applied to a substrate by means of screen printing. In this case, the compositions are applied as a smooth continuous layer rather than in a pattern. Therefore, the compositions must have appropriate viscosity so that they can be passed through the screen readily. While the theological properties are of primary importance, the organic medium is preferably formulated also to give appropriate wettability of the solid and the substrate, good drying rate, dried film strength sufficient to withstand rough handling and good firing properties. Satisfactory appearance of the fired composition is also important.

In view of all these criteria, a wide variety of inert liquids can be used as organic media. The organic medium for most thick film compositions is typically a solution of organic constituents (binder, monomer, photoinitiator, etc.) in a solvent. The solvent usually boils within the range of 130°-350° C.

The most widely used solvents for thick film applications are terpenes such as α-or β-terpineol, kerosene, dibutylphthalate, carbitol acetate, butyl carbitol acetate, hexamethylene glycol and high boiling alcohols and alcohol esters or mixtures thereof. Various combinations of these and other solvents are formulated to obtain the desired viscosity and volatility requirements for each application.

In accordance with conventional techniques the final composition may be thioxotripic or possess Newtonian characteristics dependant on the additives introduced into the composition. It is preferred that the composition be Newtonian.

The ratio of organic medium to inorganic solids in the dispersions can vary considerably and depends upon the manner in which the dispersion is to be applied and the kind of organic medium used. Normally, to achieve good coverage, the dispersion will contain complementally by weight 50-90% solids and 50-10% organic medium. Such dispersions are usually of semifluid consistency and are referred to commonly as "pastes".

The pastes are conveniently prepared on a three-roll mill. The viscosity of the pastes is typically within the range of 25-200 p.s. The amount and type of organic medium utilized is determined mainly by the final desired formulation viscosity and print thickness.

The organic medium may include small amounts of other components, e.g., pigments, dyes, thermal polymerization inhibitors, adhesion promoters, such as organosilane coupling agents, plasticizers, coating aids such as polyethylene oxides, etc. so long as the photopolymerizable compositions retain their essential properties. Organosilanes are particularly useful in quantities of 3.0 wt. % or less based on the weight of the inorganic particles. Treated particles have a lower demand for organics. Thus, the level of organics in the coating can be reduced, which results in easier burnout upon firing.

Processing

The photosensitive gold conductor compositions are conventionally applied to a substrate in the form of a film applied to the substrate or in the form of a paste applied such as by screen printing. Thereafter the gold conductor composition is imagewise exposed to actinic radiation to define areas which have been exposed. Development is achieved by removal of the unexposed areas of the layer. For semi-aqueous development the composition will be removed in portions which are not exposed to radiation but exposed portions will be substantially unaffected by using a liquid such as solutions containing 0.62 percent by sodium borate and 8.7 percent by weight butyl cellusolve in water. In the present disclosure, it is understood that in actual use, development need not be with 0.62% by weight sodium borate and 8.7 percent by weight butyl cellusolve in water, e.g., other alkalies and other solvents may be used. However, the compositions of the present invention have the capability of development in such borate and solvent solutions. In general, the amount of added solvent will be kept to the minimum required for adequate development, preferably less than 20 percent by weight. Generally, development takes place within 0.25 to 2 minutes.

Other processing steps which may be conventional can take place before a firing operation takes place. Firing is done to volatilize organic components and to sinter the inorganic binder and gold solids. Firing takes place in an oxidizing or a substantially nonoxidizing atmosphere. The preferred oxidizing atmosphere is air. By the term "substantially nonoxidizing atmosphere" is meant an atmosphere which contains sufficient oxygen to effect oxidation of the organic materials. In practice, it has been found that a nitrogen atmosphere of 10-200 ppm 02 can be used for firing the conductor compositions of the invention.

EXAMPLES

In the following examples all concentrations are v in parts by weight and degrees are in centigrade unless otherwise indicated.

Component Materials

A. Inorganics
Glass (component mole %) lead oxide (63.3), silicon dioxide (29.6), cadmium oxide (3.1), alumina (4.0)
Gold Powder: Spherical gold, particle size 1.7 to 2.7 μm.

B. Polymeric Binder
Binder: Copolymer of 90% methylmethacrylate, and 10% methacrylic acid, Mw=50,000, $T_g$=120° C., acid No. 120.

C. Monomers
Monomer I: TEOTA 1000—Polyoxyethylated trimethylolpropane triacrylate, MW 1162.
Monomer II: TMPTA—Trimethylolpropane triacrylate, D. Solvent
Butyl Carbitol acetate E. Initiators
BP: Benzophenone
MK: Michler's ketone F. Stabilizers
Benzotriazole
Ionol: 2,6-di-tert-butyl-4-methylphenol G. Dispersant
A-B Dispersant I—see description above
A-B Dispersant II—see description above.

PREPARATION OF PHOTOACTIVE SEMI-AQUEOUS PROCESSABLE PASTE

A. Preparation of Organic Vehicle

Organic components, solvent and binder polymer were mixed and heated with stirring to 135° C. and heating and stirring continued until all the binder polymer had dissolved. The solution was then cooled to 100° C. and the initiator and stabilizer added. This mixture was then stirred at 100° C. until the solids had dissolved, after which the solution was passed through a 400 mesh filter and allowed to cool.

The vehicles used had the following compositions with concentration in parts:

| Component | Vehicle I | Vehicle II |
|---|---|---|
| Binder | 30.0 | 35.0 |
| Butyl Carbitol Acetate | 64.9 | 59.9 |
| Benzophenone | 4.0 | 4.0 |
| Michler's Ketone | 0.8 | 0.8 |
| Ionol ® | 0.3 | 0.3 |
| Benzotriazole | 3.0 | 3.0 |

B. Preparation of Glass Frit

The glass frit, 8 kg, was milled in 8 liters of water in a Sweco Mill using 0.5 in diameter by 0.5 in long alumina cylinders for approximately 16 hours to achieve a D50 particle size distribution of 2.3-2.7 microns. The frit water mixture was then passed through an S. G. Franz Model 241F2 Magnetic Separator at a DC setting of 11.5 v and 30 amps.

The glass frit mixture was then freeze dried using a Virtis Consol 12 Freeze Drier. This procedure usually required three days to remove all the water.

C. Paste Formulation

The gold paste was prepared under yellow light by mixing the organic vehicle, monomer or monomers, and dispersant into a mixing vessel. The glass frit and gold powder were then added. The composition was then mixed for 30 minutes. The mixture was aged for approximately 12 hours and then roll milled using a three roll mill, at a roll pressure of 150 psi. Usually five passes through the mill were sufficient to thoroughly mix the composition. The paste was then screened through a 400 mesh screen. The paste viscosity at this point could be adjusted with butyl carbitol acetate solvent to achieve a viscosity optimum for screen printing.

D. Process Conditions

Care was taken to avoid dirt contamination in the process of preparing coating compositions and in preparing parts since such contamination can lead to defects. The process work was done in a class-100 clean room.

The paste was applied to ceramic parts by screen printing using 325-400 mesh screen. The parts were dried at between 75° and 100° C. in a nitrogen or air atmosphere oven. The dried coating had a thickness of 20 microns.

The parts were exposed through a phototarget with either a Berkey-Askor vacuum printer or a collimated HTG UV exposure source, using a 15 second nitrogen purge and a 15 second drawdown in the vacuum printer. The optimum exposure time was determined from an exposure series that yielded information on the best exposure to yield the correct size lines after development.

The exposed parts were developed using a Du Pont ADS-24 Processor containing 0.62 percent by weight sodium borate, 8.7 percent by weight butyl cellusolve and the remainder water. The temperature was maintained at 20°–45° C. Developer solution was sprayed at 30 psi for a development rate of 3.4–15 ft/minute through a 4 ft chamber. The developed parts were dried in a forced draft oven at 75° C. for 15 minutes.

The dry parts were fired in an air furnace with a peak temperature of 850° C. over a 90 minute cycle. Alternatively, they were fired in a substantially nonoxidizing nitrogen (02=10PPM) atmosphere at 900° C. for 2 and 1/2 hours.

The resolution was determined from parts exposed through the test target as the finest line spacing for which the lines were straight and non-overlapping and which could be achieved reproducibly. The photospeed was determined by measuring the light intensity at the surface of the dried photosensitive conductor composition with a light meter and multiplying by the time required for optimum exposure.

Examples 1–7

Parts were made as described above using the compositions given below. In all cases it was possible to achieve 2 mil line resolution and the photospeed was 8–72 mj/square cm. Concentrations are in parts.

|  | 1 | 2 | 3 | 4 | 5 | 6 | 7 |
|---|---|---|---|---|---|---|---|
| Gold Powder | 78 | 78 | 78 | 78 | 78 | 78 | 78 |
| Glass Frit | 5 | 5 | 5 | 5 | 4 | 5 | 5 |
| Vehicle I | 20 | — | — | — | — | 20 | — |
| Vehicle II | — | 17.5 | 20 | 15 | 12 | — | 17.5 |
| Monomer I | 3.5 | 3.5 | 3.7 | 3 | 2.8 | 3.5 | 3.5 |
| Monomer II | 0.8 | 0.8 | 1.0 | 0.5 | 0.4 | 0.8 | 0.8 |
| Dispersant I | — | — | — | — | — | 2.0 | — |
| Dispersant II | — | — | — | — | — | — | 2.0 |

What is claimed is:

1. In a semi-aqueous developable photosensitive gold conductor composition which is fireable in an oxidizing or substantially nonoxidizing atmosphere comprising an admixture of:
   (a) finely divided particles of gold solids having a surface area-to-weight ratio of no greater than 20 m²/g and at least 80 percent 0.5–10 μm and
   (b) finely divided particles of an inorganic binder having a glass transition temperature in the range of from 550 to 825° C., a surface area-to-weight ratio of no greater than 10 m²/g and at least 90 percent by weight of the particles having size of 1–10 μm, the weight ratio of (b) to (a) being in a range from 0.0001 to 0.25, dispersed in an organic vehicle comprising
   (c) an organic polymeric binder,
   (d) a photoinitiation system,
   (e) photohardenable monomer,
   (f) an organic medium
wherein the improvement comprises the organic polymeric binder is a copolymer or interpolymer selected from the group consisting of (1) a nonacidic comonomer comprising a $C_1$–$C_{10}$ alkyl acrylate, a $C_1$–$C_{10}$ alkyl methacrylate or combinations thereof, and (2) an acidic comonomer comprising an ethylenically unsaturated carboxylic acid, with the proviso that all acidic comonomers comprise from 5 to less than 15 weight percent of the polymer, wherein the organic polymeric binder has a molecular weight no greater than 100,000 and wherein the composition upon imagewise exposure to actinic radiation is developable in an aqueous solution containing 0.63 percent by weight sodium borate and 8.7 percent by weight butyl cellusolve.

2. The composition of claim 1 wherein the organic polymeric binder is a copolymer of methylmethacrylate.

3. The composition of claim 1 wherein the acidic comonomer is no greater than 15 percent by weight of the binder.

4. The composition of claim 3 wherein the molecular weight of the organic polymeric binder is no greater than 50,000.

5. The composition of claim 4 wherein said molecular weight is no greater than 20,000.

6. The composition of claim 1 wherein the organic medium is butyl carbitol acetate.

7. The composition of claim 1 wherein the organic medium contains a dispersant.

8. In a method of making a semi-aqueous developable photosensitive gold conductor composition which is fireable in a oxidizing or substantially nonoxidizing atmosphere comprising an admixture of:
   (a) finely divided particles of gold solids having a surface area-to-weight ratio of no greater than 20 m²/g and at least 80 wt. % of the particles having a size of 0.5–10 μm and
   (b) finely divided particles of an inorganic binder having a glass transition temperature in the range of from 550° to 825° C., a surface area-to-weight ratio of no greater than 10 m²/g and at least 90 wt. % of the particles having a size of 1–10 μm, the weight ratio of (b) to (a) being in a range from 0.0001 to 0.25, dispersed in an organic vehicle comprising
   (c) an organic polymeric binder, and
   (d) a photoinitiation system, dissolved in
   (e) photohardenable monomer, and
   (f) an organic medium
wherein the improvement comprises the organic polymeric binder is a copolymer or interpolymer selected from the group consisting of (1) a nonacidic comonomer comprising a $C_1$–$C_{10}$ alkyl acrylate, a $C_1$–$C_{10}$ alkyl methacrylate or combinations thereof, and (2) an acidic comonomer comprising an ethylenically unsaturated carboxylic acid, with the proviso that all acidic comonomers comprise from 5 to less than 15 weight percent of the polymer, wherein the organic polymeric binder has a molecular weight no greater than 100,000 wherein the composition upon imagewise exposure to actinic radiation is developable in an semi-aqueous solution containing 0.62 percent by weight sodium borate and 8.7 percent by weight butyl cellusolve and further wherein prior to mixing of the components, component (b) of finely divided particles of an inorganic binder is freeze dried.

9. The method of claim 8 wherein the organic medium contains dispersant.

* * * * *